(12) United States Patent
Koifman et al.

(10) Patent No.: US 11,374,545 B2
(45) Date of Patent: Jun. 28, 2022

(54) NOISE REDUCTION OF A MOS TRANSISTOR OPERATING AS AN AMPLIFIER OR BUFFER

(71) Applicant: Apple Inc., Cupertino, CA (US)

(72) Inventors: Vladimir Koifman, Rishon Lezion (IL); Anatoli Mordakhay, Hadera (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/948,791

(22) Filed: Oct. 1, 2020

(65) Prior Publication Data

US 2022/0109414 A1    Apr. 7, 2022

(51) Int. Cl.
*H03F 3/45* (2006.01)
*H03F 1/26* (2006.01)

(52) U.S. Cl.
CPC .......... *H03F 3/45269* (2013.01); *H03F 1/26* (2013.01); *H03F 3/45273* (2013.01)

(58) Field of Classification Search
CPC .... H03F 3/45269; H03F 1/26; H03F 3/45273; H03F 3/45179; H03F 3/00; H03F 3/45071; H03F 1/30; H03F 1/301; H03F 1/32; H03F 1/3205; H03F 1/3211; H03F 1/523
See application file for complete search history.

(56) References Cited

U.S. PATENT DOCUMENTS

2006/0044006 A1*   3/2006   Kiyoshi ............. H03K 19/0005
                                              326/30

\* cited by examiner

*Primary Examiner* — Jung Kim
(74) *Attorney, Agent, or Firm* — Kligler & Associates Patent Attorneys Ltd

(57) ABSTRACT

There is provided a device that includes a MOS transistor and a bias circuit coupled to the MOS transistor. The bias circuit is configured to bias the MOS transistor thereby maintaining the MOS transistor outside of saturation. The MOS transistor is configured to operate as a buffer or an amplifier, while being outside of saturation.

19 Claims, 7 Drawing Sheets

NOISE REDUCTION OF A MOS TRANSISTOR OPERATING AS AN AMPLIFIER OR BUFFER

BACKGROUND

Various analog circuits, may include a MOS transistor that operates as a buffer or an amplifier and is maintained in saturation.

Noises resulting from the operation of the MOS transistor should be reduced. Specifically, 1/f or flicker noise present a problem in a number of applications.

There is a growing need to provide an efficient method for reducing noise of a MOS transistor that operates as a buffer or an amplifier.

BRIEF DESCRIPTION OF THE DRAWINGS

The embodiments of the disclosure will be understood and appreciated more fully from the following detailed description, taken in conjunction with the drawings in which:

FIG. 5 illustrates an example of a method.

DESCRIPTION OF EXAMPLE EMBODIMENTS

Figure 1:
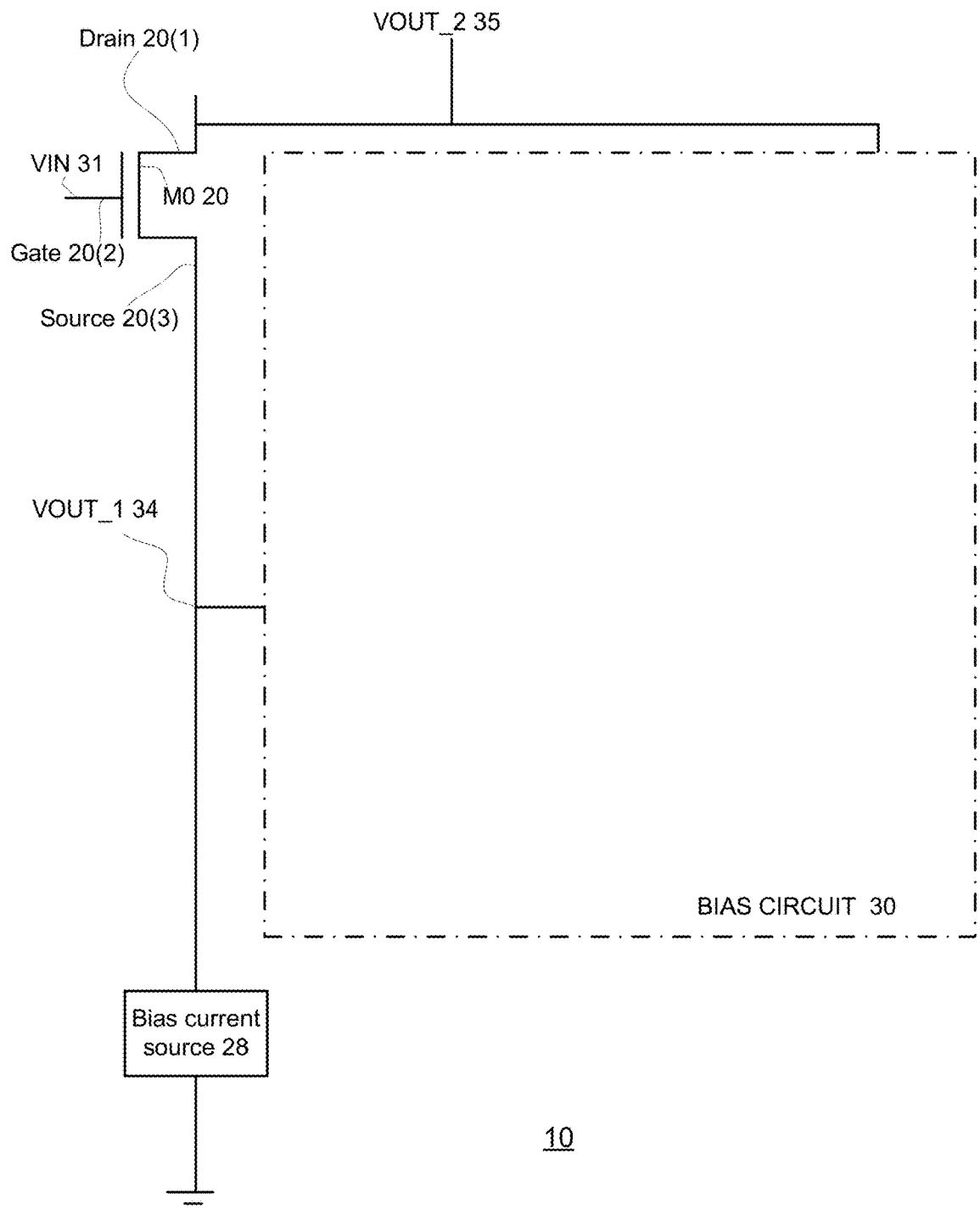
FIG. 1 illustrates an example of a device.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method.

Any reference in the specification to a system or device should be applied mutatis mutandis to a method that may be executed by the system.

Any combination of any module or unit listed in any of the figures, any part of the specification and/or any claims may be provided.

Any combination of any steps of any method illustrated in the specification and/or drawings may be provided.

Any combination of any subject matter of any of claims may be provided.

Any combinations of systems, units, components, processors, sensors, illustrated in the specification and/or drawings may be provided.

For an N-type MOS transistor (NMOS), the VDSAT is a minimum drain to source voltage (VDS) required to maintain the MOS transistor in saturation region of operation. In an NMOS transistor a VDS that is below VDSAT maintains the transistor outside of saturation or in linear region of operation. In a P-type MOS transistor (PMOS) the values of VDS are negative and thus VDSAT is the maximal VDS required to maintain the PMOS transistor in saturation region of operation. In a PMOS transistor a VDS that is above VDSAT maintains the transistor outside of saturation or in linear region of operation.

Accordingly—the VDSAT can be regarded to be VDS of a minimal absolute value for maintaining an NMOS transistor saturated. VDS having lower absolute values maintain the NMOS outside of saturation.

For simplicity of explanation, the following examples may refer to NMOS and to positive values of VDS and VDSAT. Any such example may be applied, mutatis mutandis, to PMOS transistors.

There may be provided a method and a system for biasing a MOS transistors that operates as a buffer or amplifier.

There is provided a device that may include a MOS transistor and a bias circuit coupled to the MOS transistor. The bias circuit may be configured to bias the MOS transistor thereby maintaining the MOS transistor outside of saturation.

The MOS transistor may be configured to operate as a buffer or an amplifier, while being outside of saturation.

The MOS transistor may be an NMOS transistor or a PMOS transistor. For simplicity of explanation the MOS transistor is assumed to be an NMOS transistor.

The bias circuit may be configured to set a source drain voltage (VDS) of the MOS transistor to maintain the MOS transistor outside of saturation.

Figure 2:
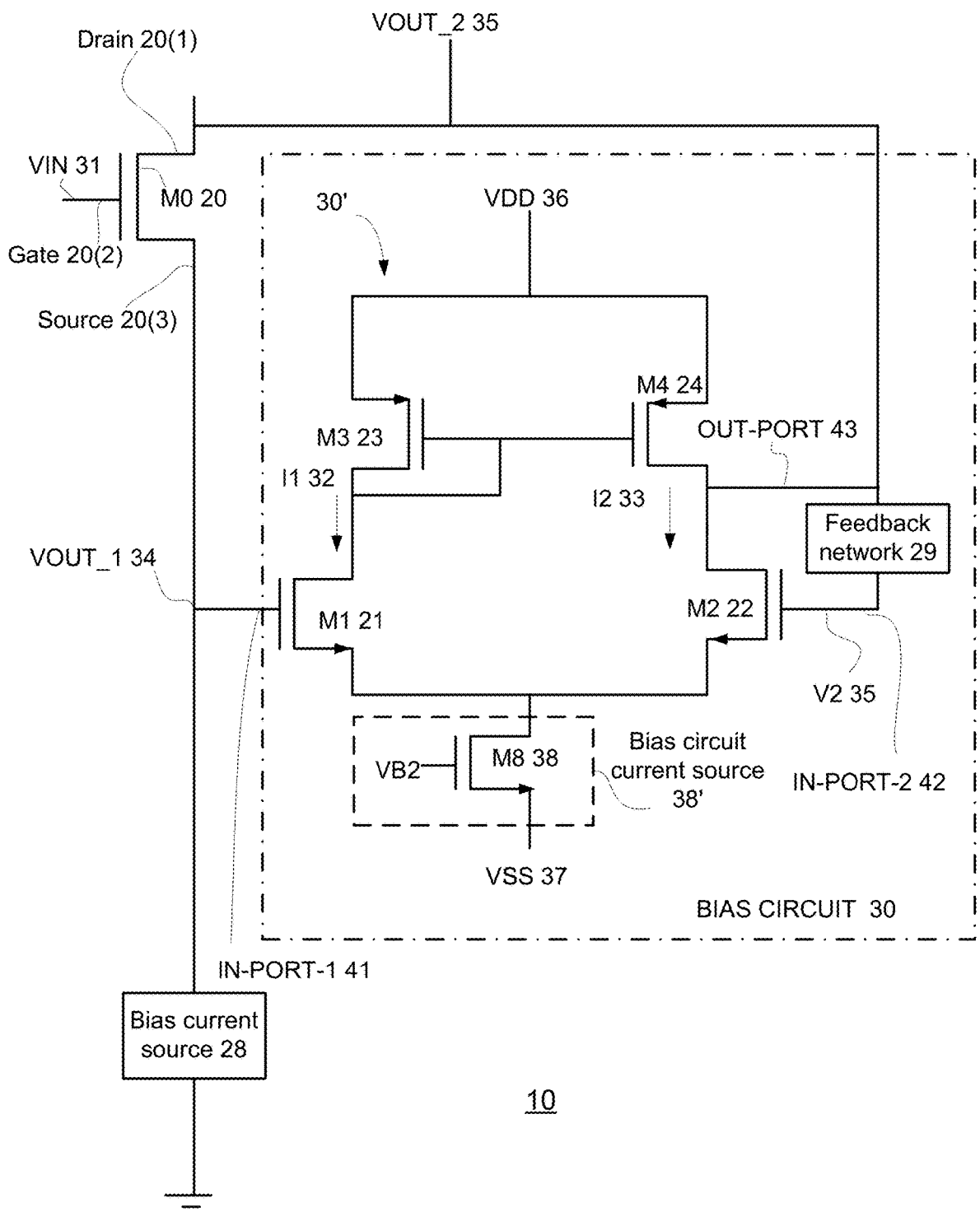
FIG. 2 illustrates an example of a device.

FIGS. 1 and 2 illustrate an example of device 10.

The device 10 includes a MOS transistor such as NMOS transistor 20. The NMOS transistor 20 include a gate 20(2) configured to receive input signal VIN 31 and either buffer or amplify the signal to provide an output signal VOUT_2 35 at its drain 20(1). The NMOS transistor 20 is also fed by a bias current source 28.

The NMOS transistor 20 may also output an additional output signal VOUT_1 34 at its source.

The output signal VOUT_2 35 and the additional output signal VOUT_1 34 may differ from each other by a DC offset.

The output signal VOUT_2 35 and the additional output signal VOUT_1 34 may differ from each other by a DC offset and by an additional voltage value that results from an amplification (is such exists) by a gain factor of the differential amplifier of VIN.

Bias circuit 30 is coupled to the source and drain of NMOS transistor 20 and sets the VDS of NMOS transistor 20—to maintain NMOS transistor 20 outside of saturation.

The bias circuit may be a fixed bias circuit that supplies a bias so that the MOS transistor is maintained outside saturation regardless of changes in the VDSAT of the MOS transistor.

The bias circuit may maintain the value of the VDS of the MOS transistor outside the range of VDS of saturation—at any operating condition of the MOS transistor.

The bias circuit may be an adaptive bias circuit as it adjusts the bias provided to the MOS transistor.

The bias circuit may perform the adjustment without measuring the state of the MOS transistor. Thus—the bias circuit may perform the adjustment without measuring the VDS of the MOS transistor.

The bias circuit may be configured to have similar behavior as these of the MOS transistor—in the sense that conditions (for example environmental conditions such as temperature and/or process variation) that may affect the VDSAT of the MOS transistor also have similar effect on the behavior of the bias circuit.

The adaptive bias circuit may be configured to track (explicitly or inherently) after changes in the VDSAT of the MOS transistor. An inherent tracking may include using a bias circuit that has similar behavior to the MOS transistor.

The adaptive bias circuit may be configured to adapt the bias of the MOS transistor based on one or more environmental conditions to which the device may be subjected. For example—after manufacturing, the process variations are set—and the temperature may change the VDSAT.

The adaptive bias circuit may be configured to adapt the bias of the MOS transistor based on one or more environmental conditions to which the device may be subjected.

The MOS transistor may exhibits a first relationship between one or more operation parameters (value of VDSAT or any other voltage, current, or power) and at least one out of process variations and one or more environmental conditions.

The bias circuit exhibits a second relationship between the one or more operation parameters and the at least one out of the process variations the and one or more environmental conditions.

The first relationship may be substantially equal to the second relationship. Substantially equal may be the same or have a deviation that still enables to maintain the MOS transistor outside of saturation. For example—deviations of up to 5, 10, 20, 30, and 40%.

Figure 3:
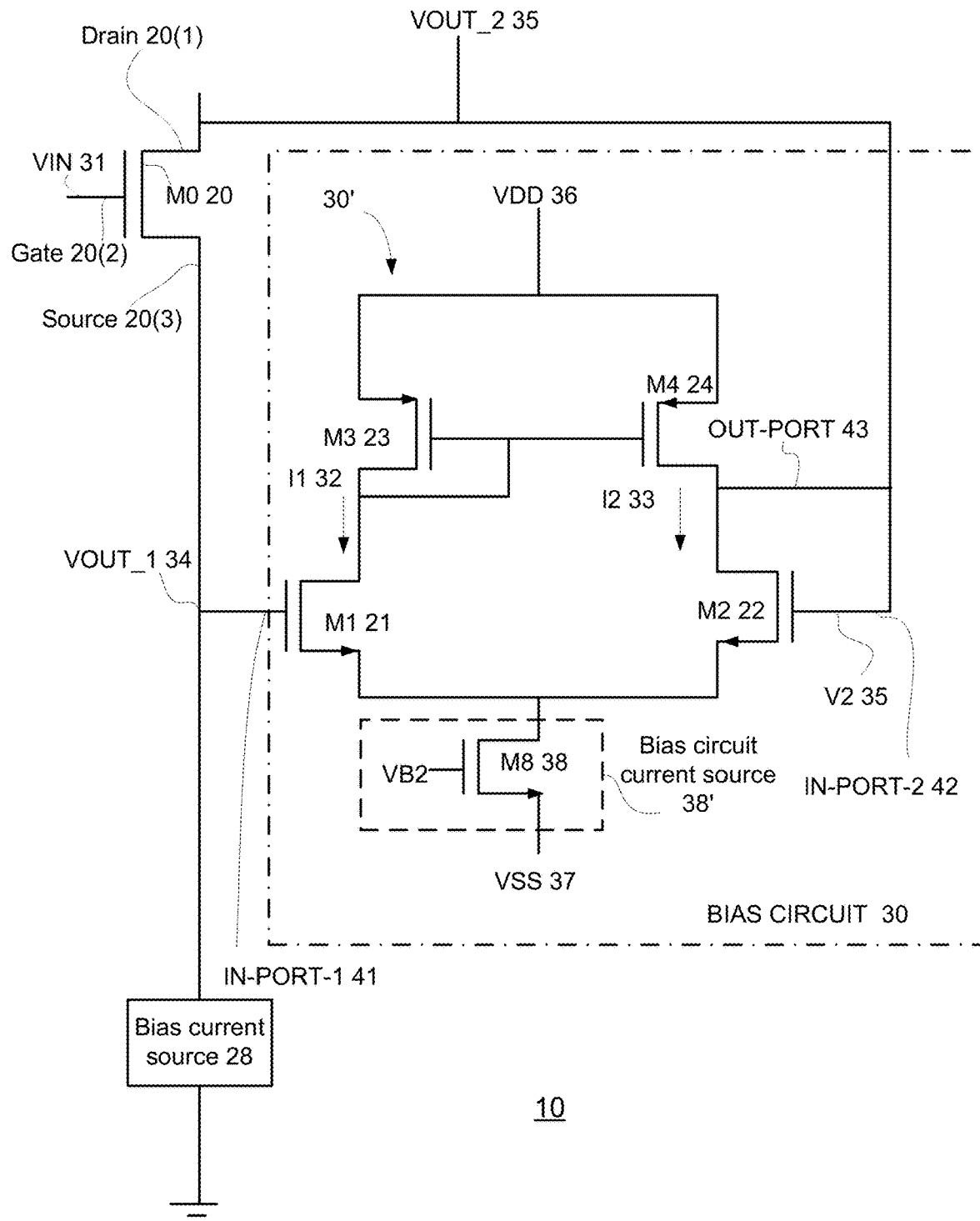
FIG. 3 illustrates an example of a device.

FIGS. 2 and 3 illustrate examples of a device 10 and includes more details regarding two different examples of the bias circuit 30.

Bias circuit 30 includes differential amplifier 30' and a bias circuit current source 38' such transistor M8 38.

The differential amplifier 30' may include a first input transistor M1 21, a second input transistor M2 22, a current mirror coupled to the first and second input transistors and a feedback network 29 that couples its output port to second input IN2 42. The feedback network may include a wire (see FIG. 3), one or more resistors, and the like. The current mirror includes third transistor M3 23 and fourth transistor M4 24.

The differential amplifier 30' include a first input IN-PORT-1 41, a second input port IN-PORT-2 42 and an output port OUT-PORT 43.

At least one of the two input transistors may have a same width to length ratio (W/L) as the MOS transistor. If both M1 and M2 have the same W/L then they should be fed by currents (I1 32 and I2 33) of different values, by the current mirror. I1 32 should stronger than I2 33.

If M1 and M2 differ from each other by their W/L then I1 32 and I2 33 may differ by value from each other or may be of the same value.

The current mirror may output I1 32 and I3 of difference values in various manners—for having M3 23 have a different size than M4 24.

The bias circuit may be very compact and may consists essentially of a differential amplifier that comprises up to five transistors.

Referring to FIG. 2—it is assumed that the differential amplifier 30' is configured to operate as a buffer (amplification factor about one) that the NMOS is an n-type MOSFET, and that M3 23 and M4 24 are saturated.

MOSFET current in saturation is:

$$I_D = \frac{\mu C_{ox}}{2} \frac{W}{L}(V_{GS} - V_T)^2 = \frac{\mu C_{ox}}{2} \frac{W}{L} V_{DSAT}^2 = K \frac{W}{L} V_{DSAT}^2$$

K is similar to all devices of the same type. Therefore, for a given device type we can find:

$$V_{DSAT} = \sqrt{I_D * \frac{L}{W}} * \sqrt{\frac{1}{K}}$$

Therefore, by modifying either $I_D$, W/L, or both we can modify the transistors $V_{DSAT}$.

For instance, operating two transistors with a W/L ratio of 4 at the same current would result in the transistor with smaller W/L ratio having $V_{DSAT}$ twice as large.

If transistors M3 23 and M4 24 are made identical, they will conduct identical current via M1 21 and M2 22 accordingly.

If M1 21 has W/L that is 4 times that of the W/L of M2 22, the equilibrium point of the differential amplifier 30' then the V2 35 (which is the voltage of drain 20(1)) is lower than V1 34 (which is the voltage of source 20(3)).

If M1 21 is operating with the same current density $$\left(I_D * \frac{L}{W}\right)$$

as M0 2U, they will have identical VDSAT values. It should be noted that the M1 21 may exhibit a different current density which is some ratio of M0's current density and simply scale accordingly.

Therefore, connecting V1 34 to source 20(3) of M0 20, and V2 35 to drain 20(1) of M0, allows to operate M0 20 with VDS=VDSAT. Using a different ratio (N) that is smaller than 4 would result in operating M0 20 with a VDS that has an absolute value that is smaller than the absolute value of VDSAT.

The bias circuit may differ from the bias circuits of FIGS. 2 and 3.

This bias circuit may be replaced by another bias circuit—for example a more complex bias circuit that may be more accurate.

The output signal of the bias circuit of FIGS. 2-3 may exhibit an error since the current of M0 20, when supplied by the bias circuit can "steal" current away from M2 22 and may alter the current density of M2 22 and therefore may change the output voltage. This can either be taken into account by calculating for the desired current and/or sizing of the transistors (especially M2 22). Alternatively—the current of the differential amplifier may be much higher than that of M0 20 thereby reducing the error. Alternatively—the device may include a different amplifier structure that is less sensitive to the stealing of the current—while being able to track changes in the VDSAT of M0 20.

While in FIGS. 1-3 the MOS transistor was a source follower—this is not necessarily so—and the MOS transistor may be operate as a for common source (CS) amplifier or as a common gate (CG) amplifier.

Figure 4:
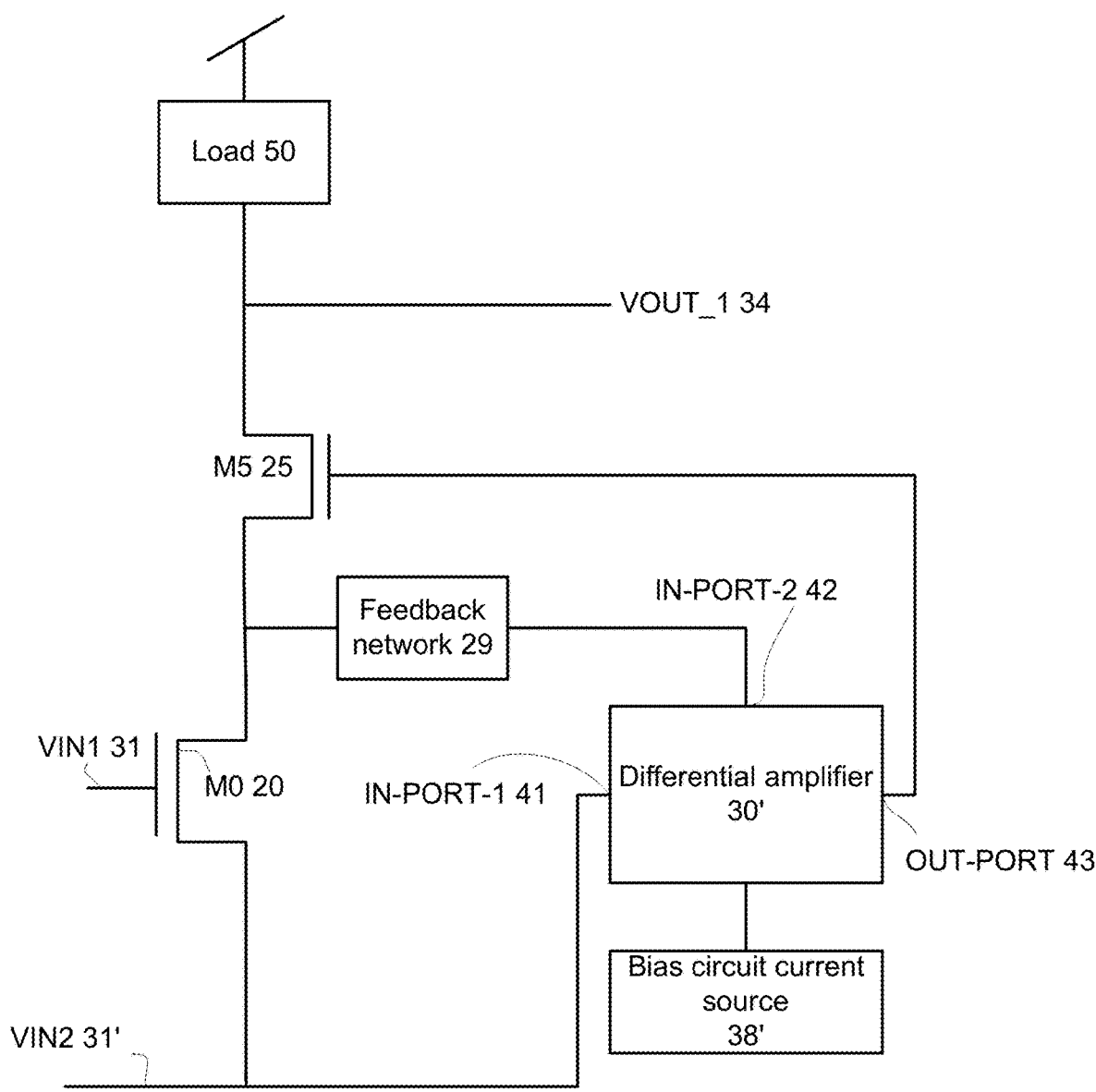
FIG. 4 illustrates an example of a device.

FIG. 4 illustrates an example of having M0 20 being a common source or common gate amplifier.

The first differential amplifier 30' (except the feedback network) has its first input IN-PORT-1 41 coupled to a second input of the device for receiving an input signal VIN2 31' when the MOS transistor is a common gate amplifier. In this case the gate of M0 20 receives a fixed voltage (ground or other value).

When operating as a common source amplifier of buffer—the input signal VIN1 31 is fed to the gate of M0 20 and the second input of the device receives a fixed voltage (ground or other value).

An additional transistor such as fifth transistor M5 25 is positioned between M0 20 and the load and output port of the device. The fifth transistor allows to steer the current generated by M0 20 to the output node while allowing the differential amplifier to bias M0 20 to maintain it outside of saturation.

In FIG. 4 the feedback network 38 is coupled between second input port IN-PORT-2 42 and an intermediate node between M0 20 and M5 25.

Figure 5:
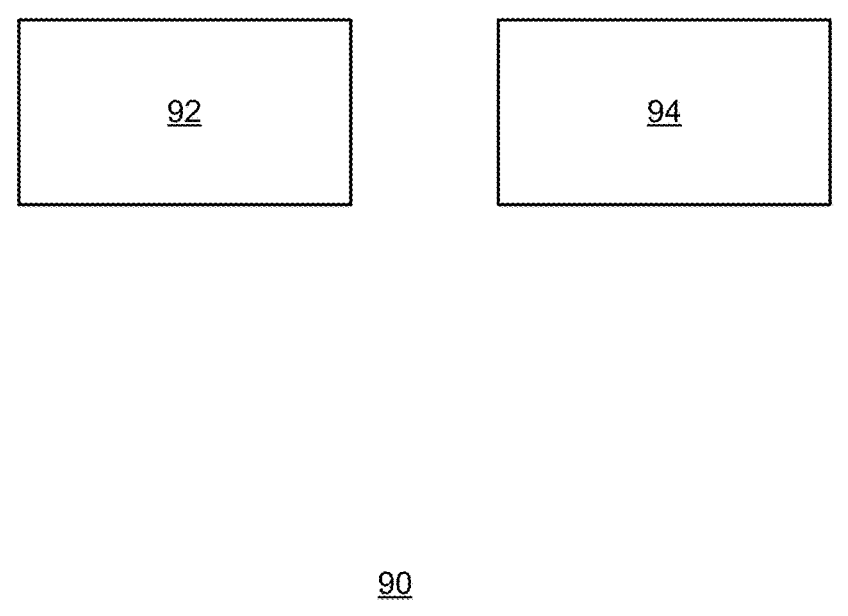

FIG. 5 illustrates method 90.

Method 90 may include steps 92 and 94.

Step 92 may include maintaining, by a bias circuit, a MOS transistor outside of saturation.

Step 94 may include amplifying or buffering an input signal, by the MOS transistor, while being outside of saturation.

The may include setting a source drain voltage of the MOS transistor to maintain the MOS transistor outside of saturation.

The bias circuit may be an adaptive bias circuit.

Step 92 may include tracking, by the adaptive bias circuit, after changes in VDSAT.

The step 92 may include adapting, by the adaptive bias circuit may be configured, the bias of the MOS transistor based on one or more environmental conditions to which the device may be subjected.

The adapting, by the adaptive bias circuit, the bias of the MOS transistor based on one or more environmental conditions to which the device may be subjected.

The MOS transistor may exhibits a first relationship between one or more operation parameters and at least one out of process variations and one or more environmental conditions; wherein the bias circuit exhibits a second relationship between the one or more operation parameters and the at least one out of the process variations the and one or more environmental conditions; wherein the first relationship may be substantially equal to the second relationship.

The bias circuit may consist essentially of a differential amplifier that comprises a first input transistors, a second input transistor, and a current mirror coupled to the first and second input transistors.

The at least one of the two input transistors may have a same width to length ratio as the MOS transistor.

The step 92 may include flowing, by the current mirror, a same current though the first input transistor and the second input transistor; wherein the first input transistor has a width to length ratio that exceeds a width to length ratio of the second input transistor.

The method flowing, by the current mirror, a first current though the first input transistor and flowing a second current through the second input transistor; wherein the first current exceeds the second current; wherein the first input transistor has a width to length ratio that equals a width to length ratio of the second input transistor.

The step 92 may include flowing, by the current mirror, a first current though the first input transistor and flowing a second current through the second input transistor; wherein the first current differs from the second current; wherein the first input transistor has a width to length ratio that differs from the width to length ratio of the second input transistor The bias circuit consists essentially of a differential amplifier that comprises up to five transistors.

Figure 6:
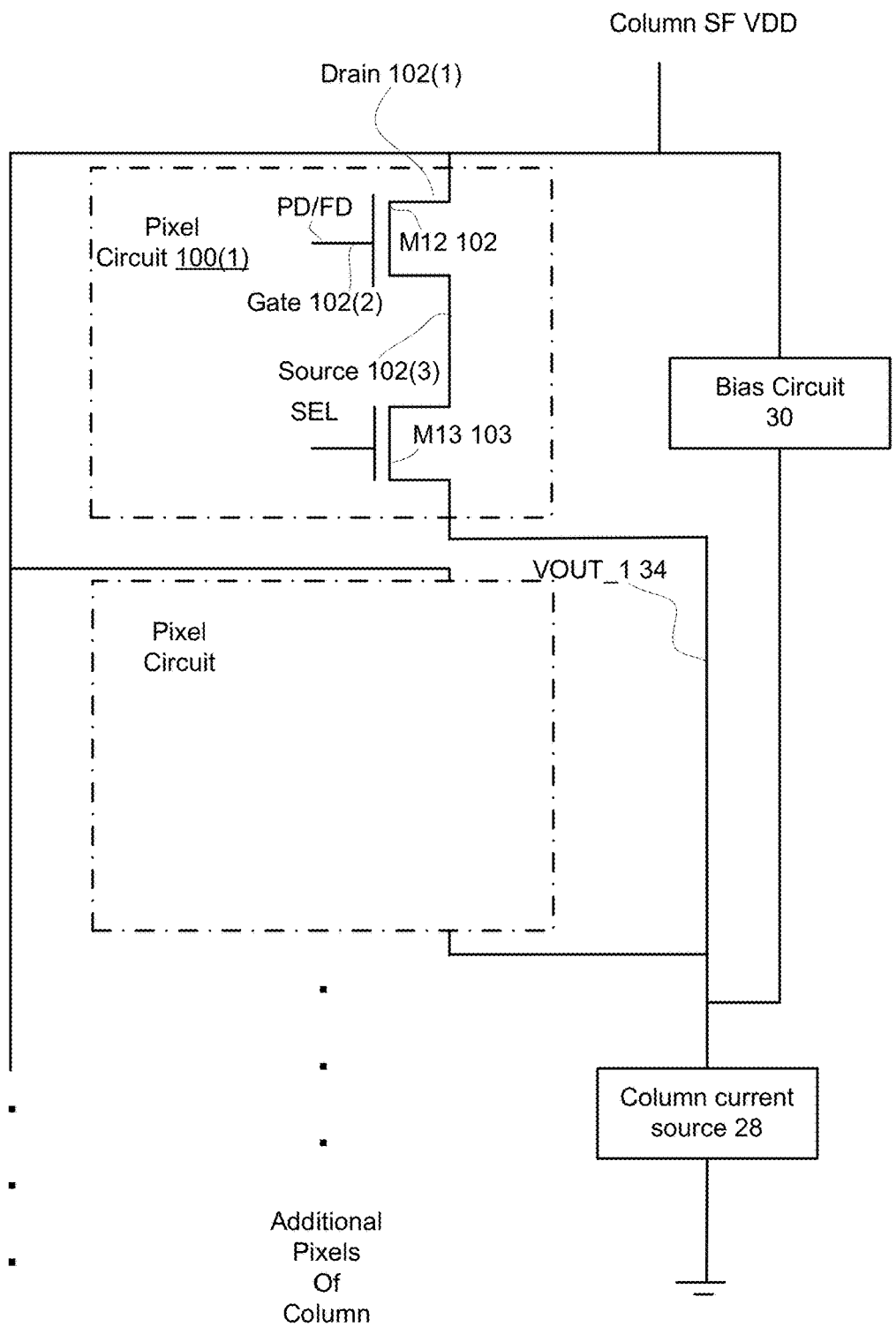
FIG. 6 illustrates an example of a device.
Figure 7:
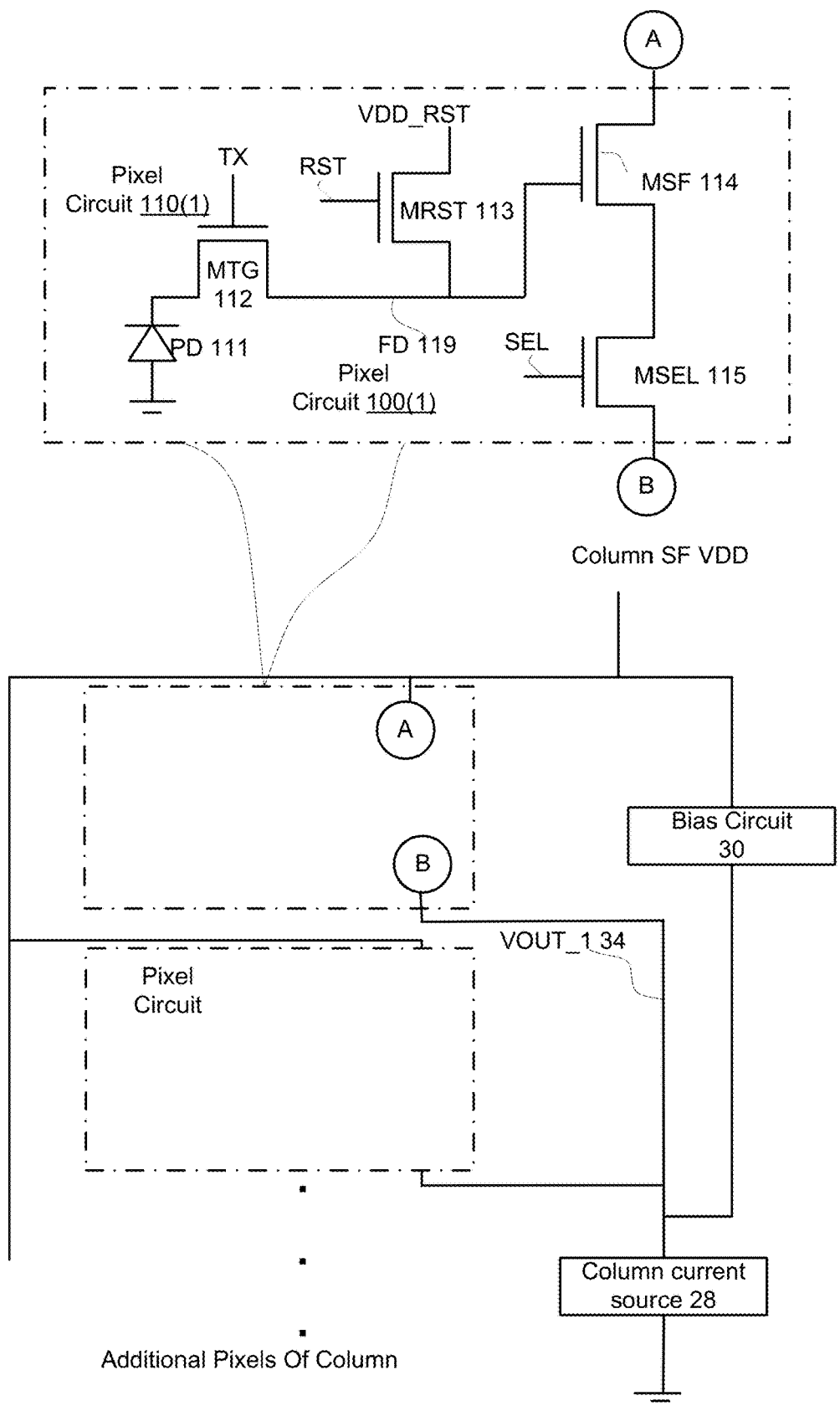
FIG. 7 illustrates an example of a device.

FIGS. 6 and 7 are examples of devices in which the bias circuit is used to reduce the noise of pixels that include radiation sensing elements such as photodiodes—or sensing elements for any other type of radiation.

In FIG. 6 a column pixel circuits such as pixel circuit 100(1) is shown as including a source follower transistor M12 102 that is coupled to another pixel transistor M13 103.

In FIG. 7 a column pixel circuits such as pixel circuit 110(1) is shown as including a source follower transistor MSF 114 that is coupled to another pixel transistor MSEL 115 and to yet additional transistors MRST 113 and TG 112, as well a radiation sensing element such as photodiode PD 111.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

We claim:

1. A device comprising a MOS transistor and a bias circuit coupled to the MOS transistor;
   wherein the bias circuit is configured to bias the MOS transistor thereby maintaining the MOS transistor outside of saturation; wherein the bias circuit is an adaptive bias circuit that consists essentially of a differential amplifier that comprises a first input transistor, a second input transistor, and a current mirror coupled to the first and second input transistors;
   wherein MOS transistor is configured to operate as a buffer or an amplifier, while being outside of saturation.

2. The device according to claim 1 wherein the bias circuit is configured to set a source drain voltage of the MOS transistor to maintain the MOS transistor outside of saturation.

3. The device according to claim 1 wherein the adaptive bias circuit is configured to track after changes in a drain to source voltage (VDSAT) having a minimal absolute value required to maintain the MOS transistor in saturation.

4. The device according to claim 1 wherein the adaptive bias circuit is configured to adapt the bias of the MOS transistor based on one or more environmental conditions to which the device is subjected.

5. The device according to claim 1 wherein the MOS transistor exhibits a first relationship between one or more operation parameters and at least one out of process variations and one or more environmental conditions; wherein the bias circuit exhibits a second relationship between the one or more operation parameters and the at least one out of the process variations the and one or more environmental conditions; wherein the first relationship is substantially equal to the second relationship.

6. The device according to claim 1 wherein at least one of the two input transistor has a same width to length ratio as the MOS transistor.

7. The device according to claim 1 the current mirror is configured to flow a same current though the first input transistor and the second input transistor; wherein the first input transistor has a width to length ratio that exceeds a width to length ratio of the second input transistor.

8. The device according to claim 1 the current mirror is configured to flow first current though the first input transistor and flow a second current through the second input transistor; wherein the first current exceeds the second current; wherein the first input transistor has a width to length ratio that equals a width to length ratio of the second input transistor.

9. The device according to claim 1 wherein the current mirror is configured to flow first current though the first input transistor and flow a second current through the second input transistor; wherein the first current differs from the second current; wherein the first input transistor has a width to length ratio that differs from the width to length ratio of the second input transistor.

10. The device according to claim 1 wherein the MOS transistor belongs to a pixel of the device, the pixel comprises a radiation sensing element.

11. A method for operating a MOS transistor, the method comprises:
    maintaining, by a bias circuit, a MOS transistor outside of saturation; wherein the bias circuit is an adaptive bias circuit that consists essentially of a differential amplifier that comprises a first input transistor, a second input transistor, and a current mirror coupled to the first and second input transistors; and
    amplifying or buffering an input signal, by the MOS transistor, while being outside of saturation.

12. The method according to claim 11 wherein comprising setting a source drain voltage of the MOS transistor to maintain the MOS transistor outside of saturation.

13. The method according to claim 11 comprising tracking, by the adaptive bias circuit, after changes in a drain to source voltage (VDSAT) having a minimal absolute value required to maintain the MOS transistor in saturation.

14. The method according to claim 11 comprising adapting, by the adaptive bias circuit is configured, the bias of the MOS transistor based on one or more environmental conditions to which the device is subjected.

15. The method according to claim 11 wherein the MOS transistor exhibits a first relationship between one or more operation parameters and at least one out of process variations and one or more environmental conditions; wherein the bias circuit exhibits a second relationship between the one or more operation parameters and the at least one out of the process variations the and one or more environmental conditions;
  wherein the first relationship is substantially equal to the second relationship.

16. The method according to claim 11 wherein at least one of the two input transistor has a same width to length ratio as the MOS transistor.

17. The method according to claim 11 comprising flowing, by the current mirror, a same current though the first input transistor and the second input transistor; wherein the first input transistor has a width to length ratio that exceeds a width to length ratio of the second input transistor.

18. The method according to claim 11 flowing, by the current mirror, a first current though the first input transistor and flowing a second current through the second input transistor; wherein the first current exceeds the second current; wherein the first input transistor has a width to length ratio that equals a width to length ratio of the second input transistor.

19. The method according to claim 11 flowing, by the current mirror, a first current though the first input transistor and flowing a second current through the second input transistor; wherein the first current differs from the second current; wherein the first input transistor has a width to length ratio that differs from the width to length ratio of the second input transistor.

* * * * *